(12) United States Patent
Zhang

(10) Patent No.: US 9,947,772 B2
(45) Date of Patent: Apr. 17, 2018

(54) SOI FINFET TRANSISTOR WITH STRAINED CHANNEL

(71) Applicant: STMICROELECTRONICS, INC., Coppell, TX (US)

(72) Inventor: John H. Zhang, Altamont, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 573 days.

(21) Appl. No.: 14/231,466

(22) Filed: Mar. 31, 2014

(65) Prior Publication Data

US 2015/0279970 A1    Oct. 1, 2015

(51) Int. Cl.
| | |
|---|---|
| *H01L 29/66* | (2006.01) |
| *H01L 29/78* | (2006.01) |
| *H01L 21/84* | (2006.01) |
| *H01L 27/12* | (2006.01) |

(52) U.S. Cl.
CPC ...... *H01L 29/66795* (2013.01); *H01L 21/845* (2013.01); *H01L 27/1211* (2013.01); *H01L 29/785* (2013.01); *H01L 29/7845* (2013.01)

(58) Field of Classification Search
CPC ......... H01L 27/10826; H01L 27/10879; H01L 27/1211
See application file for complete search history.

(56) References Cited

U.S. PATENT DOCUMENTS

| | | | |
|---|---|---|---|
| 6,284,605 B1 * | 9/2001 | Kim | H01L 21/76264 257/E21.564 |
| 6,373,111 B1 | 4/2002 | Zheng et al. | |
| 6,432,763 B1 * | 8/2002 | Yu | H01L 21/266 257/412 |
| 6,448,140 B1 | 9/2002 | Liaw | |

(Continued)

FOREIGN PATENT DOCUMENTS

| | | |
|---|---|---|
| CN | 102130057 A | 7/2011 |
| CN | 102376582 A | 3/2012 |

OTHER PUBLICATIONS

Crothers, "How Intel's 3D tech redefines the transistor (FAQ)," CNET, retrieved from, http://www.cnet.com/news/how-intels-3d-tech-redefines-the-transistor-faq/, retrieved on Dec. 11, 2014, 4 pages.

(Continued)

*Primary Examiner* — Mohammad Choudhry
(74) *Attorney, Agent, or Firm* — Seed IP Law Group LLP

(57) ABSTRACT

Stress is introduced into the channel of an SOI FinFET device by transfer directly from a metal gate. In SOI devices in particular, stress transfer efficiency from the metal gate to the channel is nearly 100%. Either tensile or compressive stress can be applied to the fin channel by choosing different materials to be used in the gate stack as the bulk gate material, a gate liner, or a work function material, or by varying processing parameters during deposition of the gate or work function materials. P-gates and N-gates are there- (Continued)

fore formed separately. Gate materials suitable for use as stressors include tungsten (W) for NFETs and titanium nitride (TiN) for PFETs. An optical planarization material assists in patterning the stress-inducing metal gates. A simplified process flow is disclosed in which isolation regions are formed without need for a separate mask layer, and gate sidewall spacers are not used.

19 Claims, 12 Drawing Sheets

(56) References Cited

U.S. PATENT DOCUMENTS

| | | | |
|---|---|---|---|
| 6,750,519 B2 | 6/2004 | Lin et al. | |
| 7,427,794 B2 | 9/2008 | Chau et al. | |
| 7,456,476 B2 | 11/2008 | Hareland et al. | |
| 7,732,878 B2 | 6/2010 | Yao et al. | |
| 7,902,058 B2 | 3/2011 | Datta et al. | |
| 7,973,389 B2 | 7/2011 | Rios et al. | |
| 8,120,073 B2 | 2/2012 | Rakshit et al. | |
| 8,129,795 B2 | 3/2012 | Datta et al. | |
| 8,298,875 B1* | 10/2012 | Or-Bach | H01L 29/4236 257/E21.411 |
| 2005/0029601 A1 | 2/2005 | Chen et al. | |
| 2006/0043424 A1 | 3/2006 | Bowen et al. | |
| 2006/0148151 A1 | 7/2006 | Murthy et al. | |
| 2007/0005949 A1 | 1/2007 | Ho et al. | |
| 2007/0072378 A1 | 3/2007 | Wu et al. | |
| 2007/0096220 A1 | 5/2007 | Kim et al. | |
| 2007/0138559 A1 | 6/2007 | Bohr | |
| 2008/0014721 A1 | 1/2008 | Bauer | |
| 2008/0096338 A1 | 4/2008 | Zhang et al. | |
| 2008/0308872 A1 | 12/2008 | Bu et al. | |
| 2009/0090976 A1 | 4/2009 | Kavalieros et al. | |
| 2009/0108378 A1 | 4/2009 | Zhu et al. | |
| 2009/0294807 A1 | 12/2009 | Yan et al. | |
| 2010/0109131 A1* | 5/2010 | Lehr | H01L 21/2855 257/649 |
| 2010/0193876 A1 | 8/2010 | Ramani et al. | |
| 2010/0197089 A1* | 8/2010 | Kim et al. | 438/199 |
| 2010/0213553 A1 | 8/2010 | Hargrove et al. | |
| 2010/0252888 A1 | 10/2010 | Iwamoto | |
| 2010/0301427 A1 | 12/2010 | Lenski et al. | |
| 2011/0198699 A1 | 8/2011 | Hung et al. | |
| 2011/0227163 A1 | 9/2011 | Wang et al. | |
| 2011/0254092 A1 | 10/2011 | Yang et al. | |
| 2011/0278676 A1 | 11/2011 | Cheng et al. | |
| 2012/0007145 A1 | 1/2012 | Chen et al. | |
| 2012/0012939 A1 | 1/2012 | Wenwu et al. | |
| 2012/0139061 A1 | 6/2012 | Ramachandran et al. | |
| 2012/0211808 A1* | 8/2012 | Wei | H01L 21/82341 257/288 |
| 2012/0248545 A1 | 10/2012 | Yugami | |
| 2012/0256265 A1 | 10/2012 | Fujimoto | |
| 2012/0306026 A1 | 12/2012 | Guo et al. | |
| 2013/0099314 A1 | 4/2013 | Lu et al. | |
| 2013/0105907 A1* | 5/2013 | Yin | H01L 29/4966 257/369 |
| 2014/0054717 A1 | 2/2014 | Edge et al. | |
| 2014/0110767 A1 | 4/2014 | Anderson et al. | |
| 2014/0120711 A1 | 5/2014 | Tsai et al. | |
| 2014/0131808 A1 | 5/2014 | Ando et al. | |
| 2014/0151763 A1* | 6/2014 | Hung | H01L 23/485 257/288 |
| 2014/0191335 A1* | 7/2014 | Yin | H01L 27/0886 257/401 |
| 2014/0299938 A1 | 10/2014 | Zhang et al. | |
| 2015/0021663 A1* | 1/2015 | Akarvardar et al. | 257/192 |
| 2015/0041897 A1* | 2/2015 | Basker | H01L 29/7848 257/347 |
| 2016/0118307 A1 | 4/2016 | Zhang et al. | |
| 2017/0011971 A1 | 1/2017 | Zhang et al. | |

OTHER PUBLICATIONS

Yang et al., "Dual Stress Liner for High Performance sub-45nm Gate Length SOI CMOS Manufacturing," IEEE, IEDM 04-1075-1077, pp. 28.8.1-28.8.3, 2004.

U.S. Appl. No. 13/856,325, filed Apr. 3, 2013, Methods and Devices for Enhancing Mobility of Charge Carriers.

U.S. Appl. No. 14/986,229, filed Dec. 31, 2015, Methods and Devices for Enhancing Mobility of Charge Carriers.

U.S. Appl. No. 15/276,516, filed Sep. 26, 2016, Methods and Devices for Enhancing Mobility of Charge Carriers.

Solid State Technology, "Analyzing strained-silicon options for stress-engineering transistors," Jul. 1, 2004, http://www.electroiq.com/articles/sst/print/volume-47/issue-7/features/software/analyzing-strained-silicon-options-for-stress-engineering-transistors.html, accessed Mar. 4, 2013, 6 pages.

F. Ootsuka et al., "Hole Mobility Enhancement Caused by Gate-Induced Vertical Strain in Gate-First Full-Metal High-κP-Channel Field Effect Transistors Using Ion-Beam W," Japanese Journal of Applied Physics 48, May 20, 2009, pp. 056502-1 to 056502-6.

Auth et al., "45nm High-k+Metal Gate Strain-Enhanced Transistors," Intel Technology Journal 12(2):77-86, 2008. (12 pages).

Martyniuk et al., "Stress in low-temperature plasma enhanced chemical vapour deposited silicon nitride thin films," Smart Materials and Structures 15 (1):529-538, 2006. (11 pages).

Mohta et al., "Mobility Enhancement: The Next Vector to Extend Moore's Law," IEEE Circuits & Devices Magazine 21 (5):18-23, 2005.

Packan et al., "High Performance Hi-K + Metal Gate Strain Enhanced Transistors on (110) Silicon," IEEE International Electron Devices Meeting, San Francisco, California, USA, Dec. 15-17, 2008, 4 pages.

Strain engineering, URL=http://en.wikipedia.org/wiki/Strain_engineering, download date Mar. 4, 2013, 2 pages.

Yang et al., "Dual Stress Liner for High Performance sub-45nm Gate Length SOI CMOS Manufacturing," IEDM Technical Digest, IEEE International Electron Devices Meeting, San Francisco, California, USA, Dec. 13-15, 2004, pp. 1075-1077.

* cited by examiner

| PARAMETER | VALUE |
|---|---|
| CHANNEL LENGTH ( L ) | 6.0 nm - 38.0 cm |
| EFFECTIVE CHANNEL LENGTH ($L_{eff}$) | 3.0 nm - 30.0 cm |
| FIN THICKNESS ($t_{si}$) | 3.0 nm - 15.0 cm |
| FIN HEIGHT ($H_{fin}$) | 5.0 nm - 35.0 cm |
| GATE DIELECTRIC THICKNESS | 0.5 nm - 3.0 cm |
| CHANNEL DOPING | $1.0 \times 10^{15} cm^{-3}$ |
| SOURCE / DRAIN DOPING | $2.0 \times 10^{20} cm^{-3}$ |
| GATE WORK FUNCTION (N-TYPE FinFET) | 4.2 - 4.5 eV |
| GATE WORK FUNCTION (P-TYPE FinFET) | 4.6 - 4.9 eV |

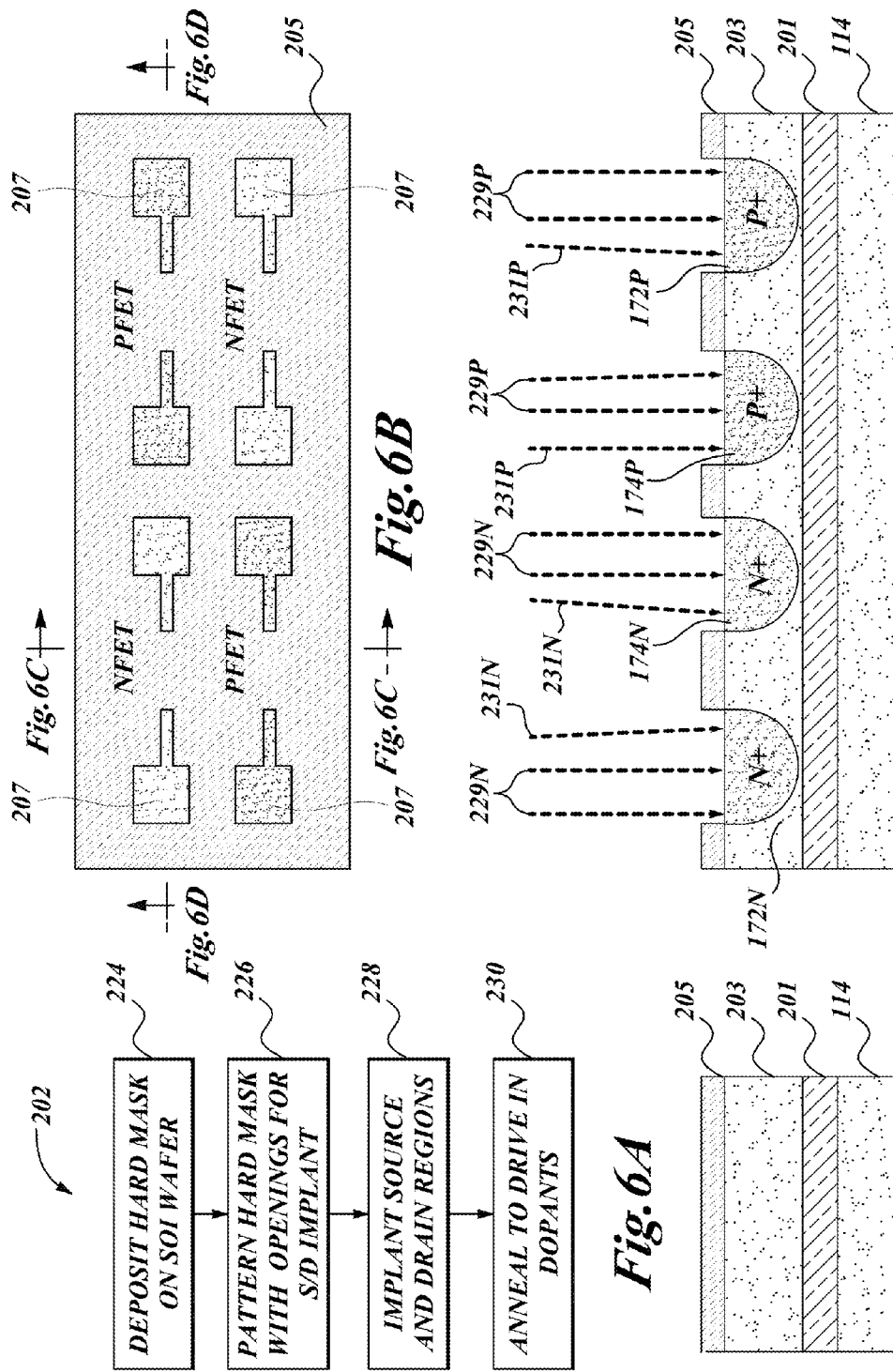

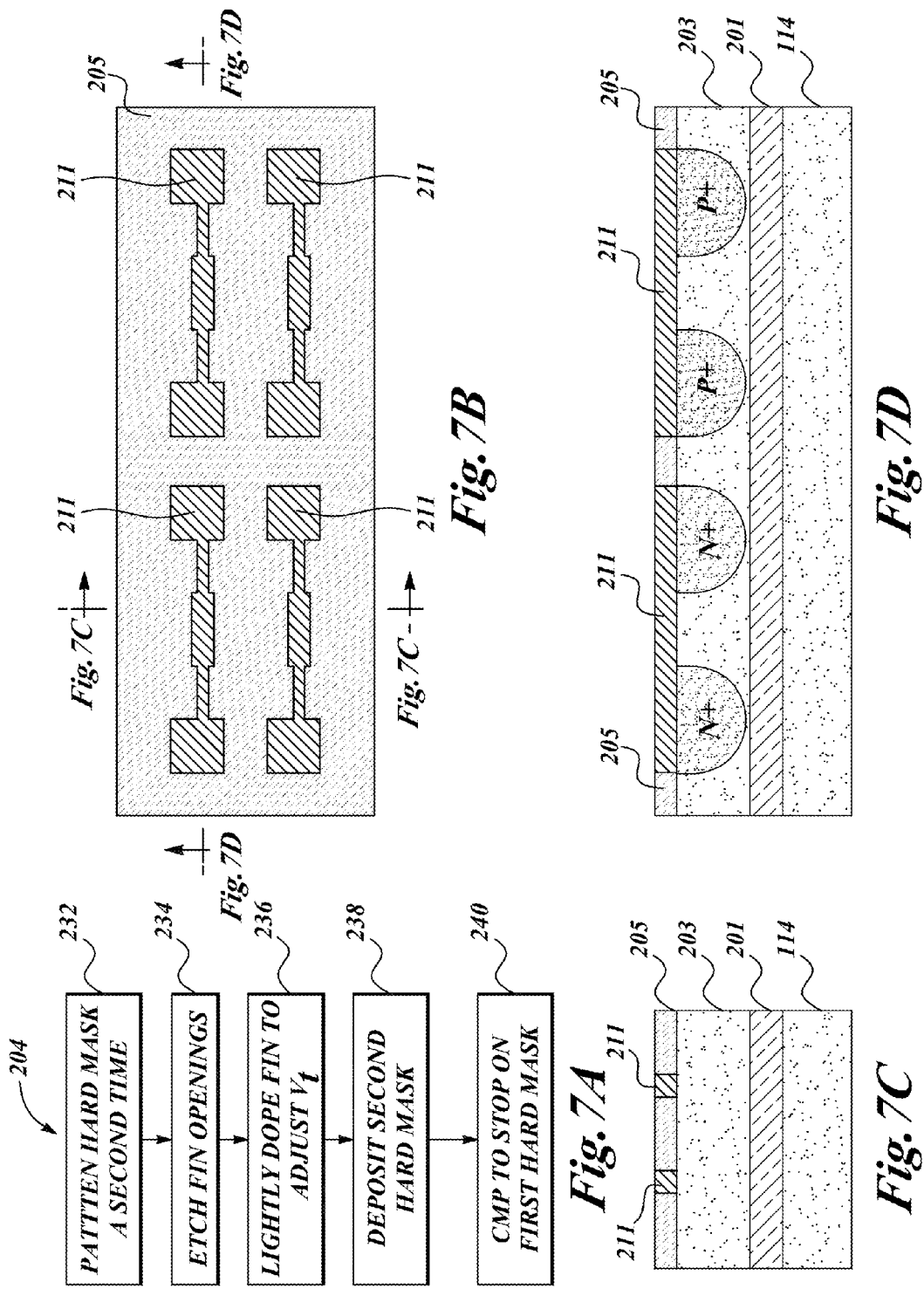

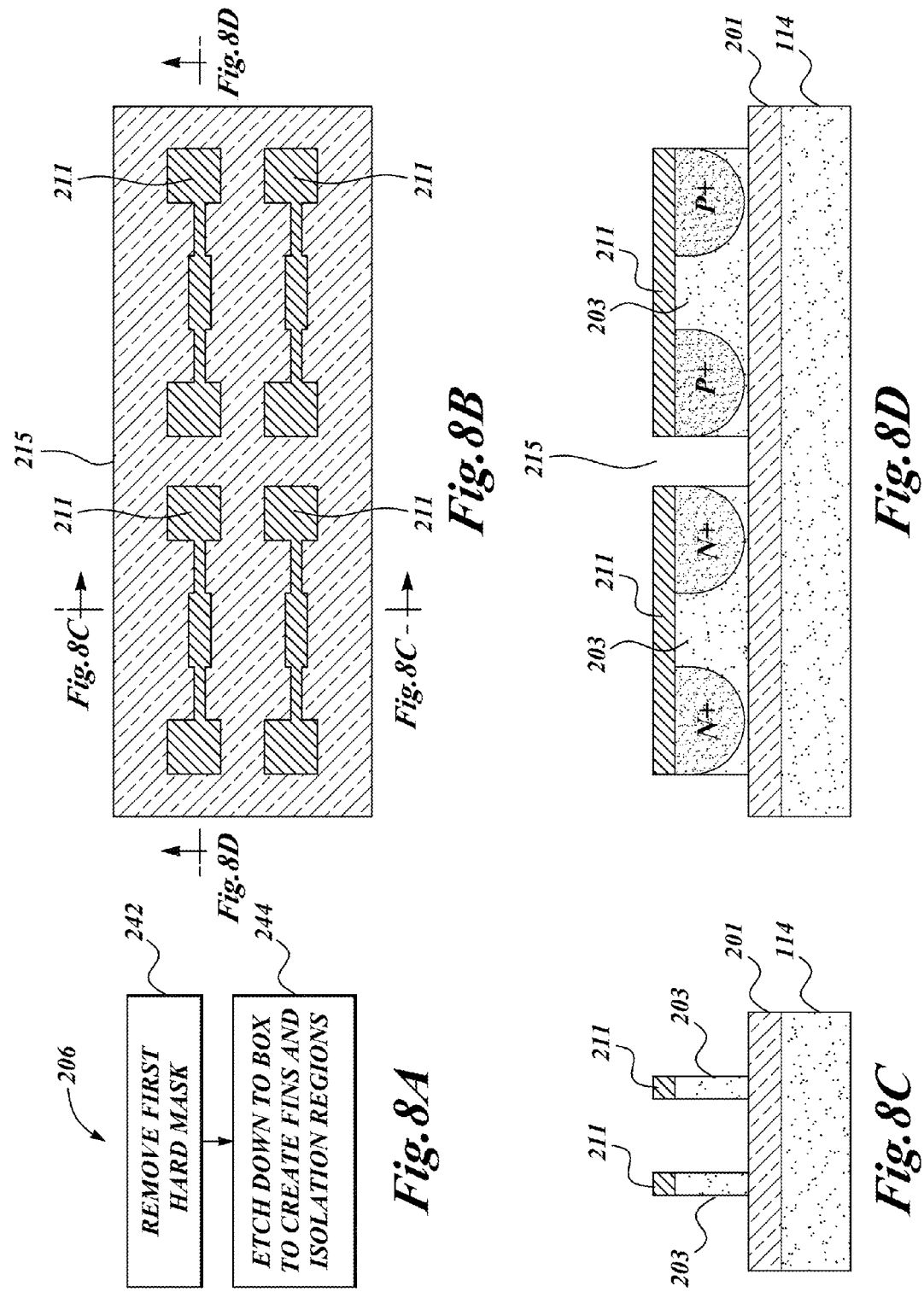

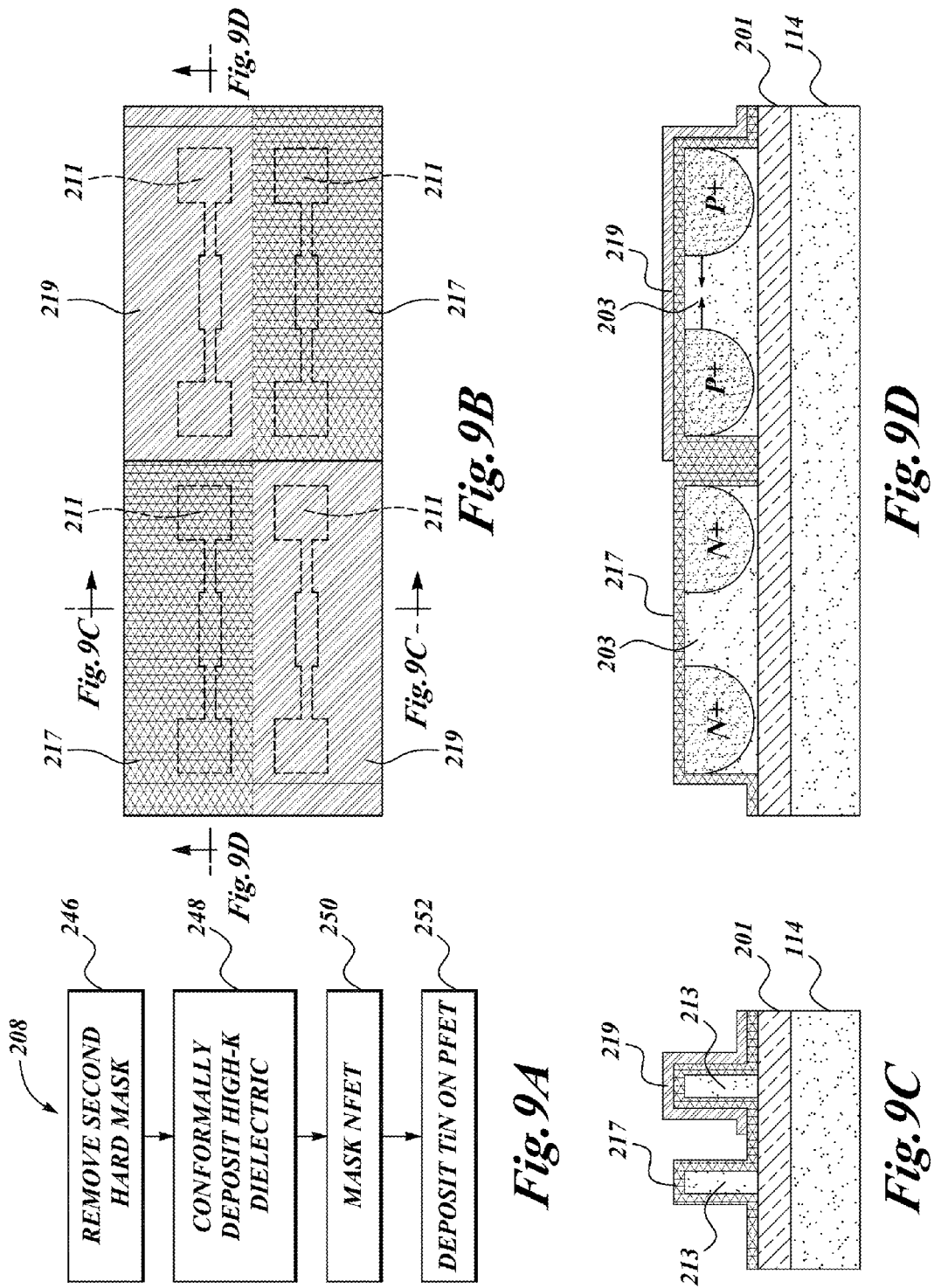

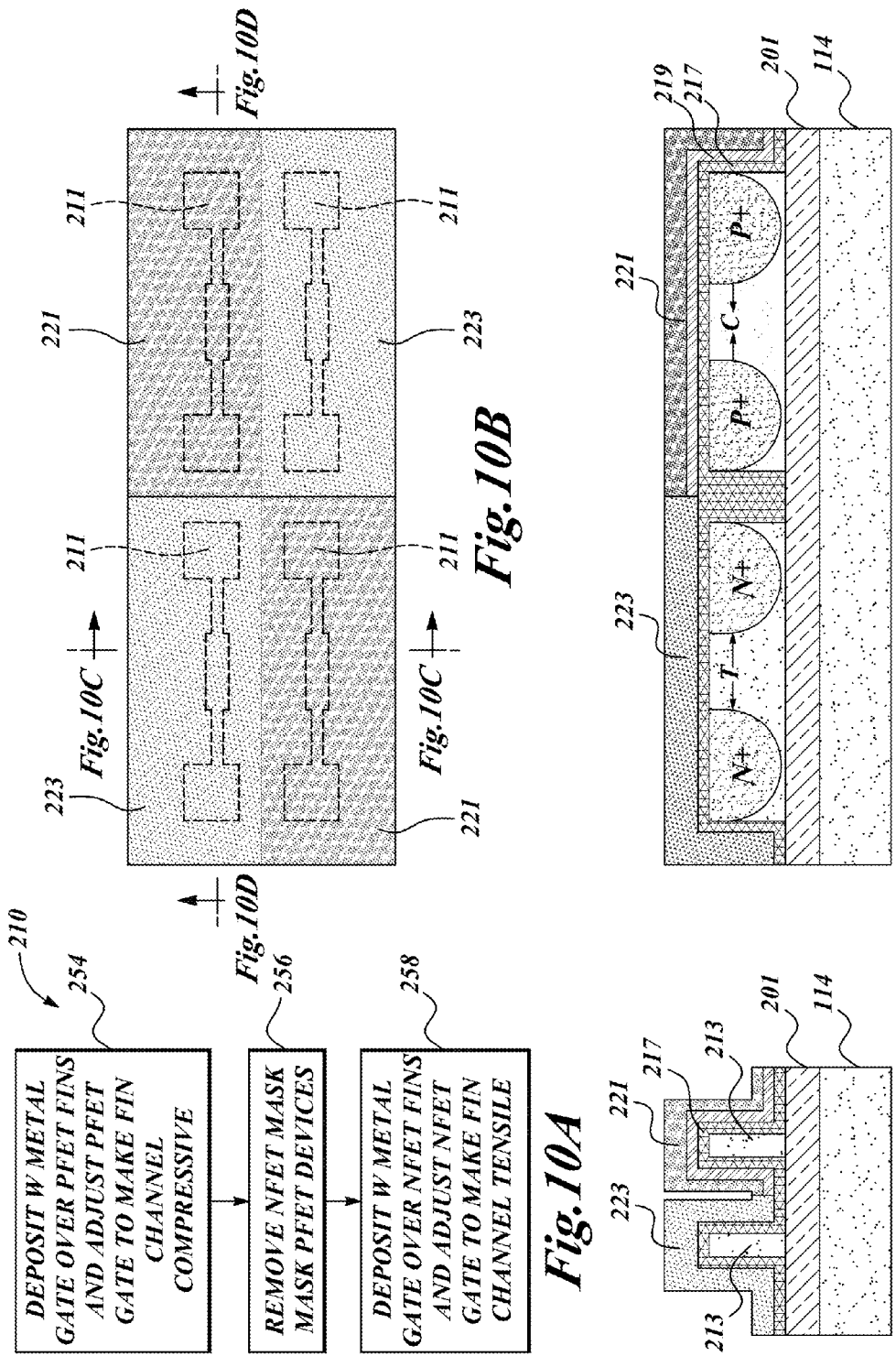

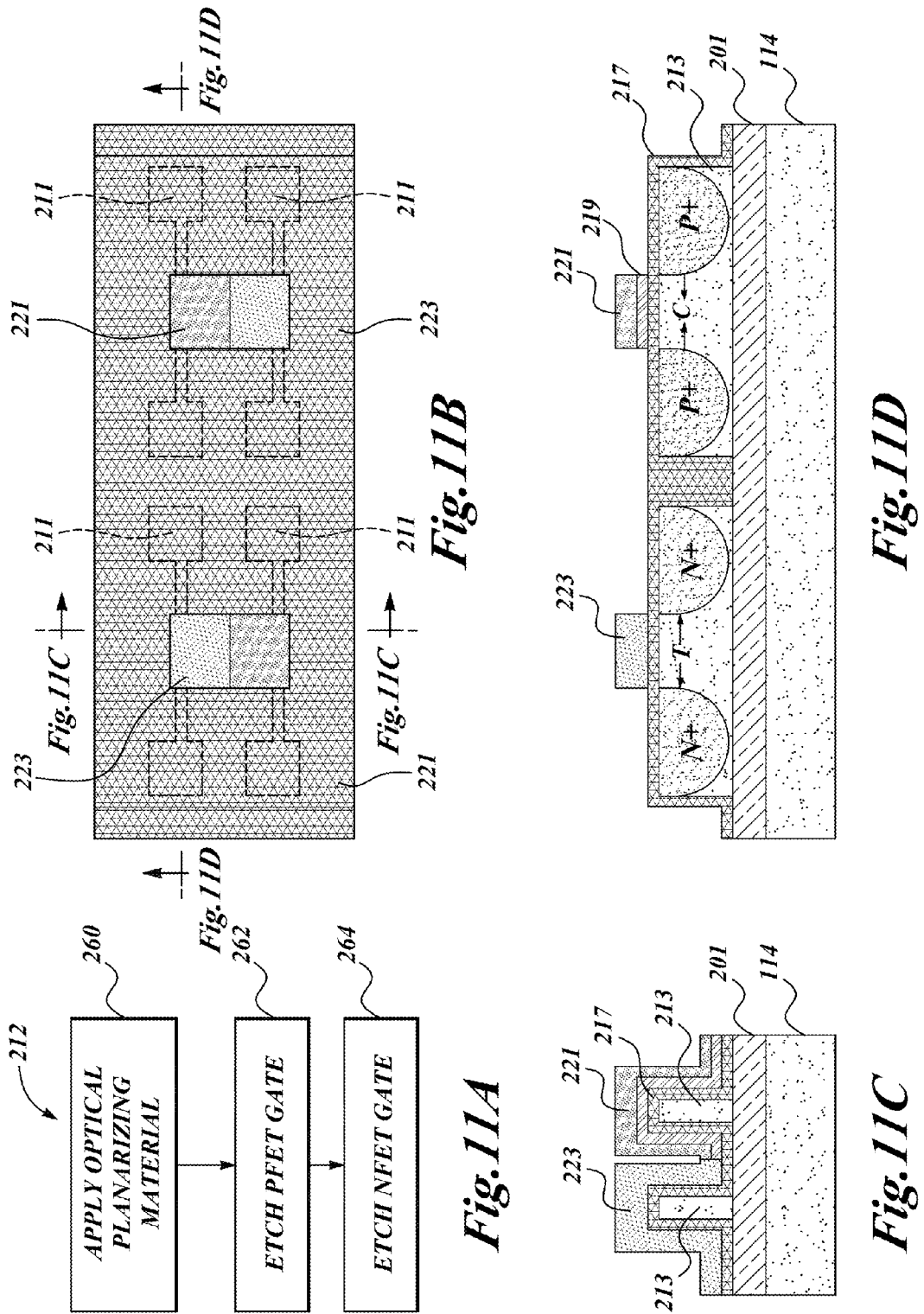

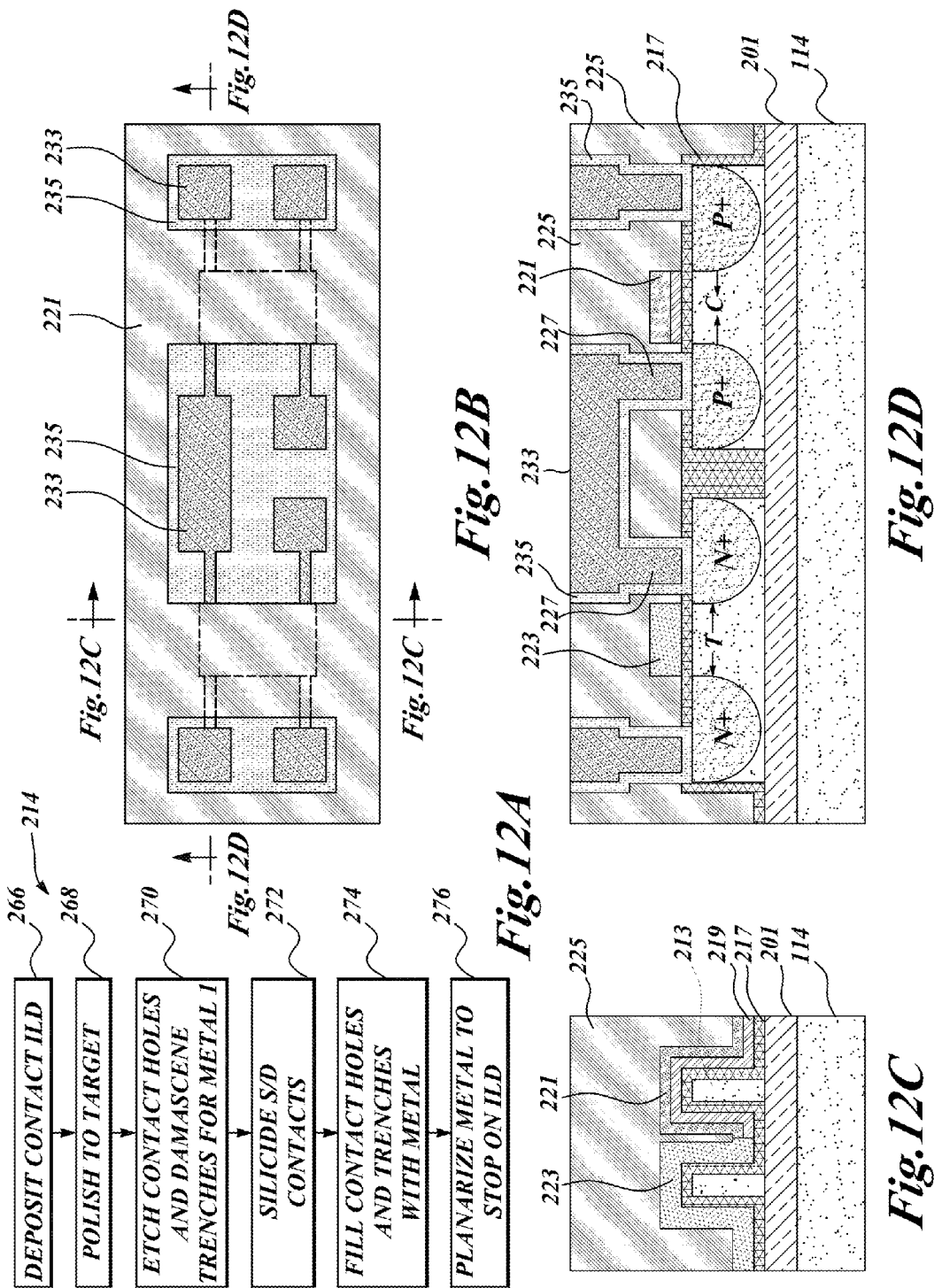

SOI FINFET TRANSISTOR WITH STRAINED CHANNEL

JOINT RESEARCH AGREEMENT

The subject matter claimed herein was made as a result of activities undertaken within the scope of a joint research agreement. The parties to the joint research agreement are (1) STMicroelectronics, Inc., and (2) International Business Machines Corporation.

BACKGROUND

Technical Field

The present disclosure relates to the fabrication of FinFET transistors built on a substrate having a buried oxide layer and, in particular, to such devices in which a metal gate directly stresses the conduction channel.

Description of the Related Art

Integrated circuits typically incorporate FETs in which current flows through a semiconducting channel between a source and a drain, in response to a voltage applied to a gate. A traditional planar (2-D) transistor structure is shown and described below in greater detail. To provide better control of the current flow, FinFET transistors, sometimes called 3D transistors, have also been developed. A FinFET is an electronic switching device in which the planar semiconducting channel of a traditional FET is replaced by a semiconducting fin that extends outward, normal to the substrate surface. In such a device, the gate, which controls current flow in the fin, wraps around three sides of the fin so as to influence the current flow from three surfaces instead of one. The improved control achieved with a FinFET design results in faster switching performance and reduced current leakage. Intel described this type of transistor in an announcement on May 4, 2011, calling it by various names including a 3D transistor, a 3-D Tri-Gate transistor, or a FinFET. (See, for example, the article titled "How Intel's 3D tech redefines the transistor" located on the internet at http://news.cnetcom/8301-13924_3-20059431-64.html; see also U.S. Publication No. 2009/0090976 to Kavalieros et al., published on Apr. 9, 2009; U.S. Pat. No. 8,120,073 to Rakshit et al.; U.S. Pat. No. 7,973,389 to Rios et al.; U.S. Pat. No. 7,456,476 to Hareland et al.; and U.S. Pat. No. 7,427,794 to Chau et al.).

Separately from the emergence of FinFETs, strained silicon transistors were developed to increase the mobility of charge carriers, i.e., electrons or holes, in the semiconducting channel. Introducing compressive stress into a PFET transistor tends to increase hole mobility in the channel, resulting in a faster switching response to changes in voltage applied to the gate. Likewise, introducing tensile stress into an NFET transistor tends to increase electron mobility in the channel, also resulting in a faster switching response.

Many methods have been developed by which tensile or compressive stress can be introduced into planar transistors. One way is by replacing bulk silicon in the source and drain regions, or in the channel itself, with epitaxially grown silicon compounds such as silicon germanium (SiGe), for example. The term epitaxy refers to a controlled process of crystal growth in which a new, epitaxial, layer of a crystal is grown from the surface of a bulk crystal, while maintaining the same crystal structure of the underlying bulk crystal. Another way to introduce stress is by introducing new channel materials such as III-V semiconductors. It has also been shown that cryogenic implantation of phosphorous atoms into the silicon is another way to increase mobility in the channel. Whereas, at room temperature, implantation causes crystal defects such as dislocations and stacking faults that must be annealed, such defects are not observed at temperatures below −60 C. Alternatively, stress can be induced from below the device by using various types of SOI substrates. Another technique that has produced high performance devices causes stress by incorporating one or more stress liners on top of the gate. (H. S. Yang et al., *International Electron Devices Meeting (IEDM) Technical Digest*, 2004, p. 1075).

Some methods of introducing stress have been investigated for use with FinFET structures. Process technologies that have been developed to fabricate FinFETs having strained channels generally have employed a replacement metal gate (RMG) process that is well known in the art. The RMG technique entails forming the fin, then putting in place a sacrificial gate, then forming the source, and drain, after which the sacrificial gate is removed and replaced with a permanent metal gate. RMG is an alternative to the conventional "metal gate first" process sequence in which the gate is formed first, and is then used as a mask for implanting source and drain regions so that the source and drain are automatically self-aligned to the gate.

BRIEF SUMMARY

Stress is introduced into the channel of a FinFET device built on a substrate having a buried oxide layer (SOI) by transfer directly from the metal gate. In SOI devices in particular, stress transfer efficiency from the metal gate to the channel is nearly 100%. Either tensile or compressive stress can be applied to the fin channel by choosing different materials to be used in the gate stack as the bulk gate material, a gate liner, or a work function material. P-gates and N-gates are therefore formed separately using different materials. Strained fin channels can be further controlled by varying processing conditions of the gate materials, in addition to varying material composition. Gate materials suitable for use as stressors include tungsten (W) for NFETs and titanium nitride (TiN) for PFETs. An optical planarization material assists in patterning the stress-inducing metal gates. A simplified process flow is disclosed in which isolation regions are formed without need for a separate shallow trench isolation (STI) mask layer, and spacers are not used.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 6A is a process flow diagram showing a detailed sequence of processing steps that can be used to form doped source and drain regions according to one embodiment described herein.

FIG. 6B is a top plan view of a layout for N-type and P-type SOI FinFET devices after carrying out the processing steps shown in FIG. 6A.

FIGS. 6C and 6D are cross-sectional views of the N-type and P-type SOI FinFET devices shown in FIG. 6B.

FIG. 7A is a process flow diagram showing a detailed sequence of processing steps that can be used to pattern fins and trenches, according to one embodiment described herein.

FIG. 7B is a top plan view of a layout for N-type and P-type SOI FinFET devices after carrying out the processing steps shown in FIG. 7A.

FIGS. 7C and 7D are cross-sectional views of the N-type and P-type SOI FinFET devices shown in FIG. 7B.

FIG. 8A is a process flow diagram showing a detailed sequence of processing steps that can be used to form the fins and isolation trenches, according to one embodiment described herein.

FIG. 8B is a top plan view of a layout for N-type and P-type SOI FinFET devices after carrying out the processing steps shown in FIG. 8A.

FIGS. 8C and 8D are cross-sectional views of the N-type and P-type SOI FinFET devices shown in FIG. 8B.

FIG. 9A is a process flow diagram showing a detailed sequence of processing steps that can be used to form a gate dielectric and fill the isolation trenches, according to one embodiment described herein.

FIG. 9B is a top plan view of a layout for N-type and P-type SOI FinFET devices after carrying out the processing steps shown in FIG. 9A.

FIGS. 9C and 9D are cross-sectional views of the N-type and P-type SOI FinFET devices shown in FIG. 9B.

FIG. 10A is a process flow diagram showing a detailed sequence of processing steps that can be used to deposit a gate stack that applies stress to the channel, according to one embodiment described herein.

FIG. 10B is a top plan view of a layout for N-type and P-type SOI FinFET devices after carrying out the processing steps shown in FIG. 10A.

FIGS. 10C and 10D are cross-sectional views of the NFET and PFET devices shown in FIG. 10B.

FIG. 11A is a process flow diagram showing a detailed sequence of processing steps that can be used to form the gate and deposit an ILD, according to one embodiment described herein.

FIG. 11B is a top plan view of a layout for N-type and P-type SOI FinFET devices after carrying out the processing steps shown in FIG. 11A.

FIGS. 11C and 11D are cross-sectional views of the N-type and P-type SOI FinFET devices shown in FIG. 11B.

FIG. 12A is a process flow diagram showing a detailed sequence of processing steps that can be used to form source and drain contacts, according to one embodiment described herein.

FIG. 12B is a top plan view of a layout for N-type and P-type SOI FinFET devices after carrying out the processing steps shown in FIG. 12A.

FIGS. 12C and 12D are cross-sectional views of the N-type and P-type SOI FinFET devices shown in FIG. 12B.

DETAILED DESCRIPTION

Figures 1A, 1B:
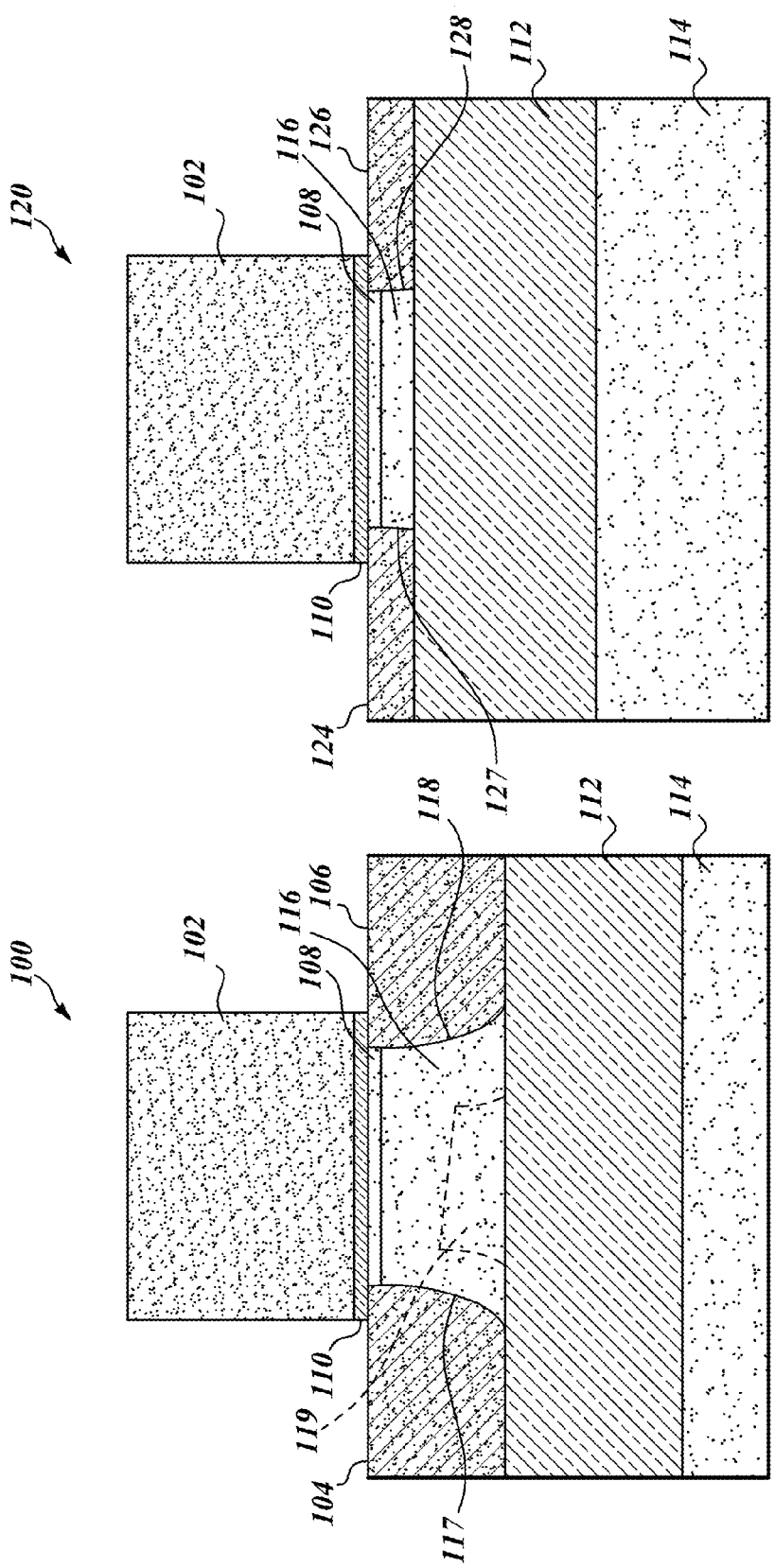
FIG. 1A is a cross-sectional diagram of a conventional partially depleted silicon-on-insulator (PDSOI) transistor.
FIG. 1B is a cross-sectional diagram of a conventional fully depleted silicon-on-insulator (FD-SOI) transistor.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to examples of FinFET structures that have been produced; however, the present disclosure and the reference to certain materials, dimensions, and the details and ordering of processing steps are exemplary and should not be limited to those shown. The term "fin" refers to a structure disposed between source and drain regions of a FinFET transistor. The term "fin channel" refers specifically to a portion of a fin that is under the influence of the transistor gate. It is noted that fins generally extend beyond the edges of the wrap-around gate. The terms "stress" and "strain" are synonymous in the sense that when a stress is applied to a material, the material experiences strain. Thus, the term "stress" is associated with an action, while the term "strain" describes the effect of stress.

FIGS. 1A and 1B provide general information about silicon-on-insulator (SOI) transistors, familiar to those skilled in the art of transistor design. FIG. 1A shows a partially depleted MOS SOI transistor 100 in cross section. Like standard bulk MOS transistors, the SOI transistor 100 is a three-terminal device in which a voltage applied to a gate 102 causes current to flow from a source 104 to a drain 106 through a channel 108. The gate 102 is separated from the rest of the device by a thin capacitive gate oxide layer 110. The SOI transistor 100 differs from a bulk MOS transistor in that there exists a buried oxide (BOX) layer 112 between the channel 108 and a bulk silicon substrate 114. A depletion region 116, depleted of charge, that forms below the channel 108, between the source and drain regions 104 and 106, is then bounded below by the BOX layer 112. The presence of the BOX prevents the substrate voltage from electrically influencing the channel 108. Otherwise, the extent of the depletion region depends on the relative dimensions of the various layers, as well as source and drain doping profiles, 117 and 118, respectively, and doping concentrations of the source and drain regions. In the case of the partially depleted SOI device shown in FIG. 1A, the depletion region 116 does not fill all of the material between the source and the drain, wherein an un-depleted portion 119 remains at an undetermined floating electric potential. The presence of the un-depleted portion 119 is generally undesirable because it is not well controlled, and yet the associated floating electric potential can electrically influence the channel and degrade the transistor performance.

A fully depleted SOI (FD-SOI) transistor 120 is shown in FIG. 1B in cross section. Like the partially depleted SOI transistor 100 shown in FIG. 1A, the FD-SOI transistor 120 also has a BOX layer 112. However, the source and drain regions of the FD-SOI device, 124 and 126 respectively, are shallower than the source and drain regions 104 and 106 of the SOI transistor 100. As a result, doping profiles 127 and 128 are effectively vertical, and the charge characteristics of the channel can be set by the doping concentrations such that a fully charge-depleted region 116 forms between the shallow source and drain regions 124 and 126, bounded below by the BOX layer 112, in response to application of a bias voltage to the gate 102. Because all of the material between the source and drain is charge-depleted, the un-depleted portion 119 shown in FIG. 1A has been eliminated as a possible cause of transistor degradation.

Figure 2B:
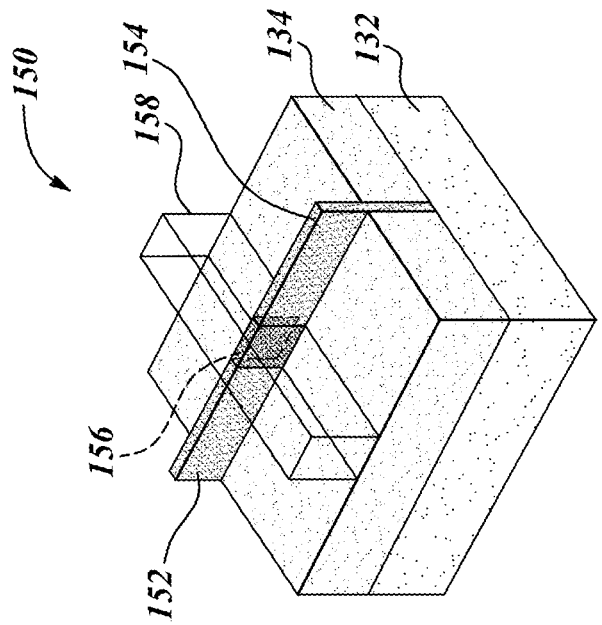
FIG. 2B is a pictorial perspective view of a prior art FinFET.
Figure 2A:
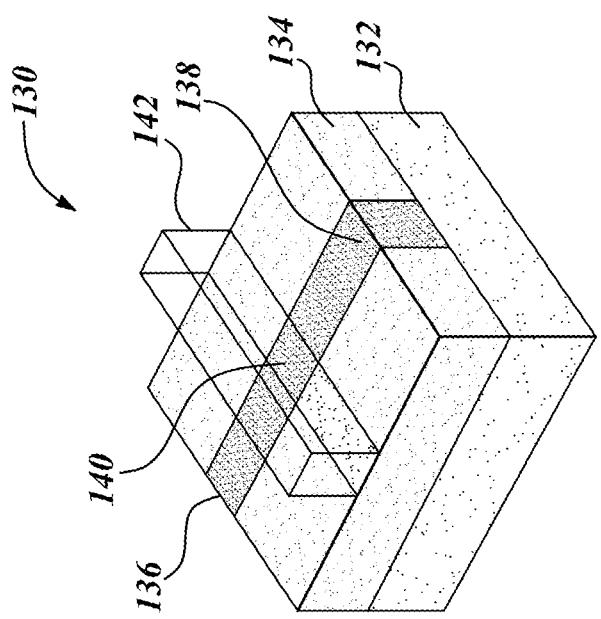
FIG. 2A is a pictorial perspective view of a conventional planar FET according to the prior art.

FIGS. 2A and 2B provide general information about FinFETs, familiar to those skilled in the art of transistor design. FIG. 2A shows a conventional planar transistor 130 built on a silicon substrate 132. FIG. 2A, a non-FinFET device, is included herein for comparison with the FinFET shown in FIG. 2B. Parts of the conventional planar transistor include an active region 134, a source 136, a drain 138, a planar conducting channel 140, and a gate 142. A gate dielectric, not shown, electrically isolates the channel from the gate, as is well known in the art. The active region 134 occupies a top layer of the substrate that may be doped with impurities to create a well having a net negative or net positive charge. When the conventional planar transistor 130 is on, current flows from the source 136 to the drain 138, through the planar conducting channel 140. Current flow in the planar conducting channel is controlled by the gate 142 by application of a gate voltage. An electric field associated with the gate voltage has the effect of turning on the conventional planar transistor 130 if the gate voltage exceeds a certain threshold. If the applied gate voltage drops below the threshold voltage, the conventional planar transistor 130 shuts off and current ceases to flow from the source 136 to the drain 138. Because the gate 142 can only influence the planar conducting channel 140 from one side (i.e., from the top of the planar conducting channel 140), charge leakage into the silicon substrate 132 tends to occur at the channel/substrate junction.

FIG. 2B shows a conventional FinFET device 150 built on the silicon substrate 132. Analogous to the device shown in FIG. 1A, parts of the conventional FinFET device 150 include an active region 134, a source 152, a drain 154, a conducting fin channel 156, and a wrap-around gate 158. The active region 134 of the conventional FinFET device 150 may be doped with impurities to create a well having a net negative or net positive charge. When the conventional FinFET device 150 is on, current flows from the source 152 to the drain 154, through the tall, conducting fin channel 156, under control of the wrap-around gate 158. Application of a voltage having a value that exceeds a certain threshold voltage value turns the conventional FinFET device 150 on. If the applied voltage drops below the threshold voltage value, the conventional FinFET device 150 shuts off and current ceases to flow from the source 152 to the drain 154. Because the wrap-around gate 158 influences the conducting fin channel 156 from three sides, improved control of the conduction properties of the conducting fin channel 156 is achieved. Such improved control causes leakage of charge from the conducting fin channel 156 to the silicon substrate 132 to be reduced, although not eliminated. Because the current-carrying capacity of the fin channel 156 is much greater than that of the planar conducting channel 140, the switching characteristics of the conventional FinFET device 150 are also improved over those of the conventional planar transistor 130.

Figure 3:
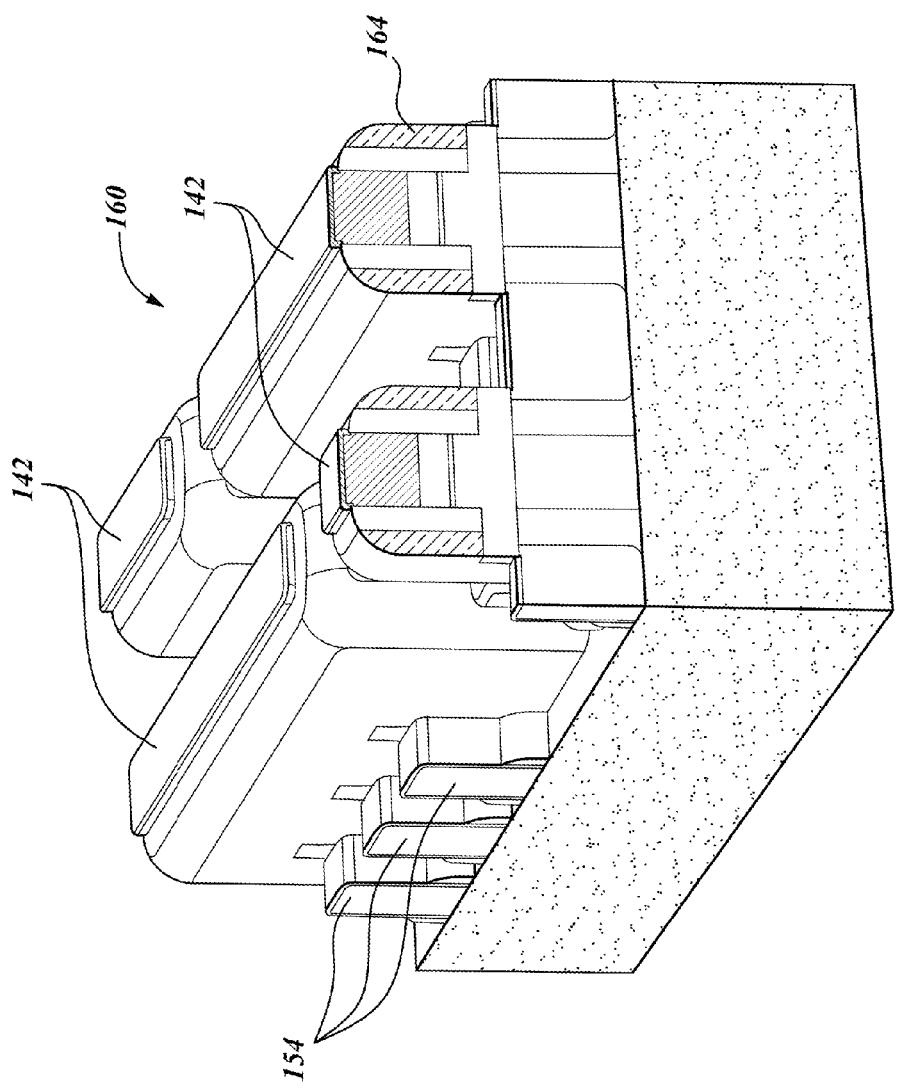
FIG. 3 is a combined 3-D pictorial perspective view and cross-sectional view of a conventional FinFET device.

FIG. 3 shows a 3-D view of a conventional FinFET in which three fins are shown being controlled by the same gate structure that includes a metal gate 142. FIG. 3 also includes a cross-sectional view of the gate structure in particular, including a pair of spacers 164 that are typically made of an insulating material such as silicon nitride. FIG. 3 is provided for comparison with the gate structure of the strained SOI FinFET device described herein, which does not include spacers. By omitting spacers from the design, an entire mask layer and associated material processing (e.g., all of the steps involved in deposition, lithography, etching, cleaning, and so forth) is saved in design and fabrication of the strained FD-SOI FinFET, which results in a significant cost saving for manufacturing the strained FD-SOI FinFET.

Figures 4A, 4B:
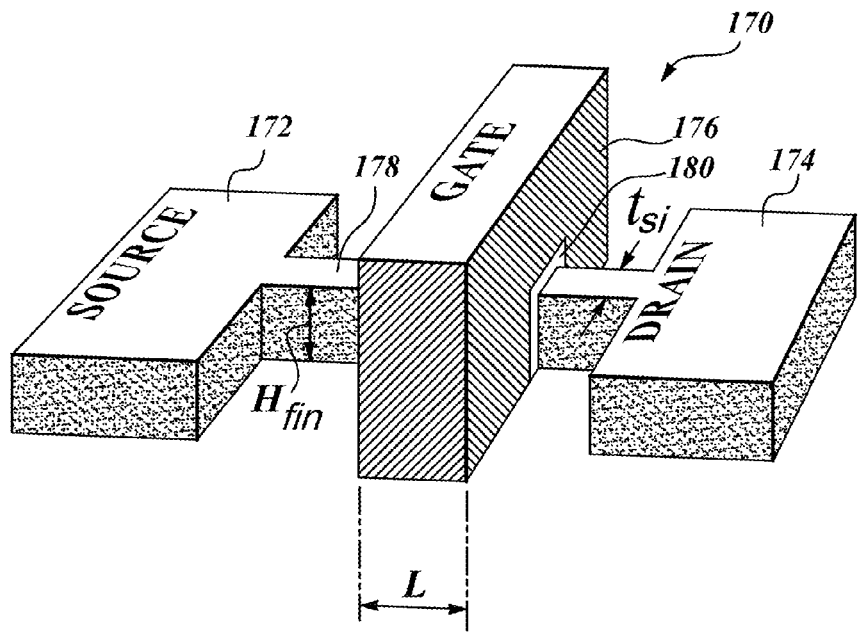
FIG. 4A is a 3-D pictorial view of the fin and the source, drain, and gate terminals of the SOI FinFET device described herein, according to one embodiment.
FIG. 4B is a data table listing various physical dimensions of the SOI FinFET device shown in FIG. 4A.

FIG. 4A shows the basic device geometry of a single fin FD-SOI FinFET device 170 as described herein, including source 172, drain 174, and metal gate 176 terminals, as well as the fin 178, and the gate dielectric 180. Exemplary dimensions of the terminals are indicated, for example the fin height, $H_{fin}$; the channel length, L; and the fin thickness, $t_{si}$.

FIG. 4B lists exemplary numerical values for such dimensions, as well as other parameters of interest. Exemplary values of doping concentrations for the source 172, drain 174, and fin 178 are also given, as well as exemplary values of work functions associated with materials used to form the metal gates 176 of N- and P-type devices, respectively. The channel length, L, describes the physical width of the strained fin channel under influence of the metal gate 176. The effective channel length $L_{eff}$ refers to the channel width that an un-strained, non-SOI FinFET would need to achieve comparable performance. Thus, the use of a strained channel and an SOI substrate causes a 30 nm FinFET channel to behave like a 15 nm FinFET channel.

Figure 5:
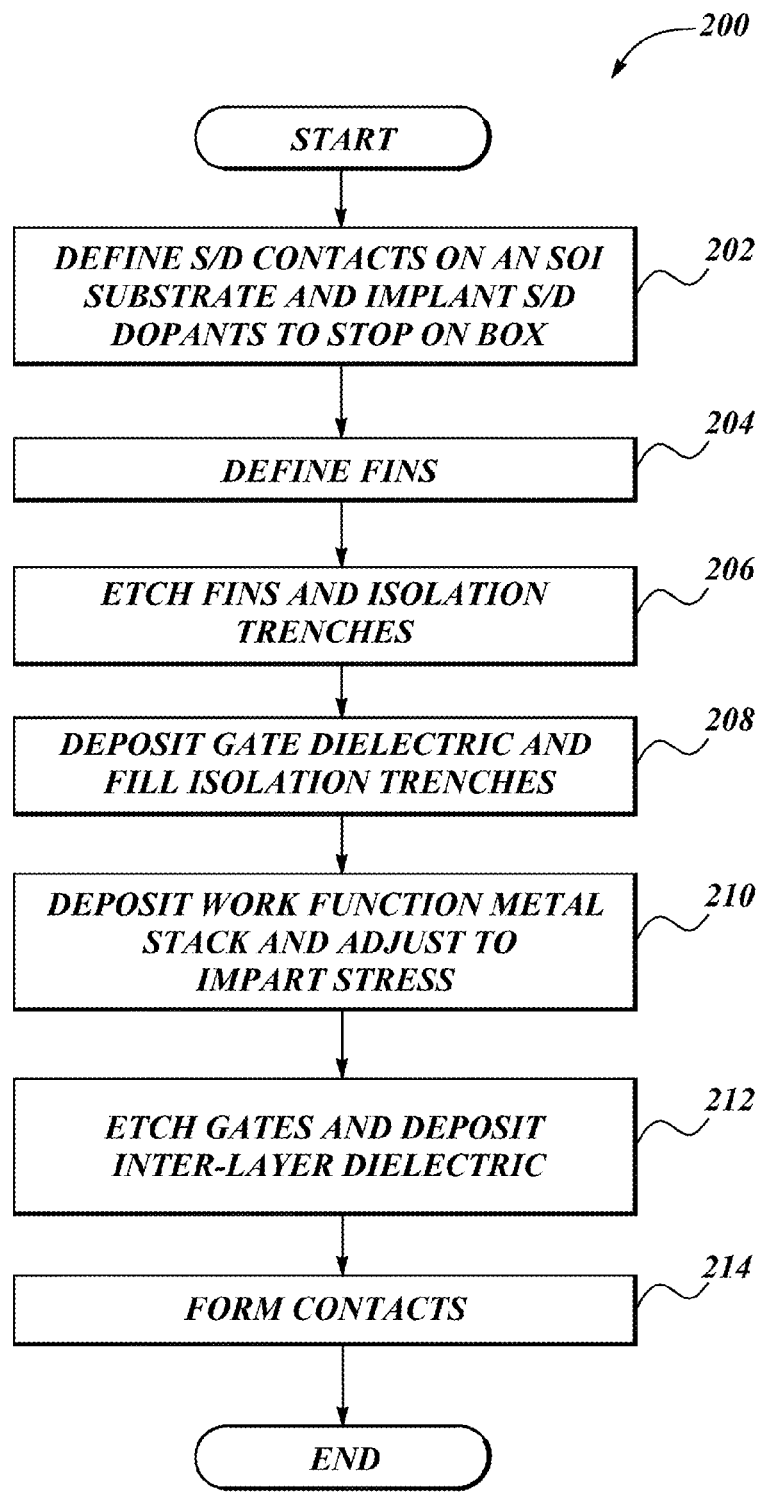
FIG. 5 is a high-level flow diagram describing basic actions in a fabrication process for a strained SOI FinFET transistor, according to one embodiment described herein.

FIG. 5 shows a high-level sequence of actions in a fabrication process 200, according to one embodiment. Using the fabrication process 200, a FinFET device can be built on an SOI wafer in which stress in the fin channel is induced by a metal gate. The fabrication process 200 begins with an SOI wafer that includes a layer of buried oxide (BOX) 201 within the silicon substrate 114. The BOX layer 201 has a thickness within the range of about 5-100 nm. The region of the silicon located above the BOX layer 201 is an electrically active region 203 where FinFETs will be formed. The thickness of the active region 203 is within the range of about 5-35 nm. SOI wafers are generally much more expensive than bulk silicon wafers. As an alternative to purchasing SOI wafers as a start material, SOI wafers can be fabricated from bulk silicon wafers.

At 202, source and drain contacts are defined by a first hard mask 205 on an SOI substrate. Source and drain dopants are then implanted through openings in the first hard mask 205. The depth of the implanted ions is limited by the depth of the BOX layer 201.

At 204, openings are formed in the first hard mask 205 and filled with a second hard mask 211 to pattern fins 213.

At 206, the fins 213 and isolation trenches 215 separating the N-type and P-type devices are etched in the same processing step. While the fins 213 are formed by removing the surrounding silicon in the active region 203, the isolation trenches 215 are formed, simultaneously, by etching trenches into the surrounding silicon in the active region 203.

At 208, the second hard mask 211 is removed and a high-k dielectric material 217 is conformally deposited so as to cover the fins 213 while simultaneously filling the isolation trenches 215. The portion of the dielectric that covers the fins 213 will be the gate dielectric for the FinFET.

At 210, a work function metal stack is deposited to form separate gate stacks for the PFET and NFET devices. The deposition process is adjusted to achieve a desired degree of stress for transfer to the fin channels.

At 212, stress-inducing gates are formed by etching the work function metal stack. An inter-layer dielectric is also deposited over the transistors.

At 214, source and drain contacts 233 are formed using a dual damascene process.

FIGS. 6A-12D show and describe in further detail steps in the method 200. In each set of Figures for the subsets of A-D, A is a detailed flow diagram; B is a top plan view showing the transistor layout at the current layer; C is a cross-sectional schematic view through the gate regions of both a negative channel (NFET) device and a positive channel (PFET) device; and D is a cross-sectional view through the source, drain, and gate of a PFET transistor, in particular. In accordance with convention, arrows on each cut line represent the direction of an observer's eye looking at the corresponding cut plane. The cross-sectional views C, D correspond to the area within the solid rectangle shown in the plan view B.

FIG. 6A describes the initial process step 202 in further detail, as a sequence of steps 224-230 that can be used to implant dopants into the source and drain regions down to a lower boundary formed by the BOX, as shown in FIGS. 6B, 6C, and 6D according to one embodiment.

FIG. 6B shows a top plan view that corresponds to the two cross sections shown in FIGS. 6C and 6D as described above. The squares shown in FIG. 6B define source and drain contact openings 207 which align to, but are slightly smaller than, the doped source and drain regions that define the NFET and PFET devices. Future locations of contact vias for access to the fin channels are foreshadowed by fields shown as gaps between the square source and drain contact openings 207 in FIG. 6B.

At 224, the first hard mask 205 is formed on the SOI wafer, for example, by depositing a silicon nitride film having a thickness within the range of about 35-45 nm.

At 226 the first hard mask 205 is patterned with openings for source and drain implants.

At 228, four implantations are carried out, two for the P-type devices, and two separate implants for the N-type devices, with the use of photoresist masks. The implantation steps form P+ and N+ source regions, 172p and 172n, respectively, and P+ and N+ drain regions 174p and 174n. Vertical implantations 229p and 229n are directed substantially normal to the surface. The implantation 229p drives positive ions, such as, for example, boron ions, into the active region 203 to create the P-doped source and drain regions 172p and 174p of the PFET device. The implantation 229n drives negative ions, such as, for example, arsenic or phosphorous ions, into the active region 203 to create the N-doped source and drain regions 172n and 174n of the NFET device. Slightly diagonal implantations 231p and 231n, directed at a small angle to a surface normal, are carried out to optimize curved doping profiles bordering the channel. The desired concentration of boron dopants in P-doped source and drain regions 172p and 174p is within the range of about 1.0 E19-1.0 E21 atoms/cm$^3$, with a target concentration of about 2.0 E20 atoms/cm$^3$. The desired concentration of negative dopants in the N-doped regions 172n and 174n is within the range of about 1.0 E19-1.0 E21 atoms/cm$^3$, with a target of about 2.0 E20 atoms/cm$^3$.

At 230, the wafer is annealed to drive the dopants through the active region 203 down to the BOX layer 201, and to repair damage to the silicon crystalline structure caused by the implantation step. Such an annealing process is well known in the art.

FIG. 7A describes the process step 204 in further detail, as a sequence of steps 232-240 that can be used to define the fins 213 and to deposit a second hard mask, as shown in FIGS. 7B, 7C, and 7D according to one embodiment.

At 232, the first hard mask 205 is patterned a second time using a photoresist mask to define the fins 213.

At 234, fin gate openings are etched in the first hard mask 205 using a brief, conventional SiN reactive ion etching process.

At 236, an additional ion implantation step may be carried out to lightly dope the region underneath the fin gate openings, for threshold voltage adjustment.

At 238, a second hard mask 211 is conformally deposited over the patterned first hard mask 205 to fill the fin gate openings. The second hard mask 211 can be made of silicon dioxide ($SiO_2$), for example.

At 240, a CMP step is carried out to remove the second hard mask 211 above the level of the fin gates, selective to the first hard mask (SiN).

FIG. 8A describes the process step 206 in further detail, as a sequence of steps 242-244 that can be used to etch the fins 213 and form isolation trenches 215, as shown in FIGS. 8B, 8C, and 8D according to one embodiment.

At 242, the first hard mask 205 is removed using a reactive ion etching process, while the second hard mask 211 remains.

At 244, etching is continued down to the BOX layer 201, thus simultaneously forming the fins 213 and the isolation trenches 215 separating the NFET and PFET devices.

FIG. 9A describes the process step 208 in further detail, as a sequence of steps 246-252 that can be used to form the gate dielectric 180 and fill the isolation trenches 215, as shown in FIGS. 9B, 9C, and 9D according to one embodiment.

At 246, the second hard mask is removed using, for example, a wet etch process such as a hydrogen fluoride (HF) dip that is selective to silicon.

At 248, a high-k dielectric material 217 is conformally deposited over the fins 213 so as to simultaneously fill the isolation trenches 215 with the high-k dielectric material 217. The high-k dielectric material 217 can be, for example, halfnium oxide ($HfO_2$) or aluminum oxide ($Al_2O_3$). The dielectric constant of the high-k gate dielectric material 217 is desirably greater than about 4.0 and the thickness of the high-k gate dielectric material 217 is desirably within the range of about 2-20 nm above the surface of the substrate, and covering the fins 213. Because the gate oxide and the isolation regions are formed together, a mask layer is eliminated from the standard process sequence, which incurs significant manufacturing cost savings.

At 250, the NFET devices are masked with photoresist.

At 252, a work function material 219 such as titanium nitride (TiN) is deposited over the PFET devices.

FIG. 10A describes the process step 210 in further detail, as a sequence of steps 254-258 that can be used to deposit a work function metal stack and adjust the stack so as to impart stress to the fin channels, as shown in FIGS. 10B, 10C, and 10D according to one embodiment.

At 254, while the NFET devices are still masked, a metal gate layer 221p, for example, tungsten (W) is deposited on top of the work function material 219. The metal gate layer 221 can be adjusted during deposition of the tungsten film to make the channels of the PFET devices more or less compressive (C). Such an adjustment can entail varying one or more deposition process parameters such as, for example, RF power, gas flow, processing temperature, or target film thickness. Furthermore, such an adjustment can entail use of an automatic in-line process control method in which strain in the channel region of the PFET device is measured downstream or in situ, and the measurements are fed back to the deposition equipment to adjust the process parameters.

At 256, the mask covering the NFET devices is removed and the PFET devices are masked using conventional methods known to those skilled in the art of lithography.

At 258, a metal gate layer 223, for example, tungsten (W), is deposited on top of the high-k material 217 of the NFET devices. The metal gate layer 223 can be adjusted during deposition of the tungsten film to make the channels of the NFET devices more or less tensile (T). Such an adjustment can entail varying one or more deposition process parameters such as, for example, RF power, gas flow, processing temperature, or target film thickness. Furthermore, such an adjustment can entail use of an automatic in-line process control method in which effects of stress imparted to the channel region of the NFET device are measured downstream or in situ, and the measurements are fed back to the deposition equipment to adjust the process parameters. Alternatively, a different choice of metal gate material for the NFET devices can be used to achieve tensile stress instead of compressive stress.

FIG. 11A describes the process step 212 in further detail, as a sequence of steps 260-264 that can be used to etch the metal gate 176 and to deposit an inter-layer dielectric (ILD), as shown in FIGS. 11B, 11C, and 11D according to one embodiment.

At 260, an optical planarization layer (OPL) such as, for example, a spin-on glass (SOG) is applied on top of the metal gate layers 221 and 223. The OPL planarizes the surfaces of the metal gates to allow patterning the gates without distortion.

At 262, the PFET gates are etched using an etch chemistry that has a high selectivity to the high-k gate oxide 217. Such an etch chemistry can be fluorine- or chlorine-based. Fluorine is desirable because it introduces fewer defects.

At 264, NFET gates are etched using a similar etch chemistry to that used for the PFET gates. It is desirable to etch the NFET and PFET gates separately because the differences in strain in the gate materials can affect aspects of the etch process, such as the etch rate, or the amount of material removed.

FIG. 12A describes the process step 214 in further detail, as a sequence of steps that can be used to form contacts to the gate, source, and drain terminals of the NFET and PFET devices, as shown in FIGS. 12B, 12C, and 12D according to one embodiment. It is noted that there are no sidewall spacers on the gates of the devices described herein. Thus, another mask layer is eliminated from the standard process sequence, which incurs further significant manufacturing cost savings.

At 266, an insulating material is formed, for example, an inter-layer dielectric (ILD) 225 such as silicon dioxide ($SiO_2$) or a low-k dielectric material such as, for example, a fluorine-doped oxide (fluorosilicate glass), a carbon-doped oxide, or a porous oxide. The ILD 225 is conformally deposited as a layer of thickness within the range of about 10-400 nm.

At 268, the ILD 225 is planarized to a target thickness of about 10-80 nm above the fin using CMP techniques that are well known in the art.

At 270, a two-step etching process is carried out according to a standard dual damascene process. First, contact openings 227 are etched through the ILD 225, down to the N+ and P+-doped source and drain regions 172. Then, trenches 233 are etched into the ILD 225, extending to a depth equal to the desired thickness for the first metal layer. The widths or critical dimensions (CDs), of the trenches generally exceeds that of the contact openings 227.

At 272, the contact resistance at the bottom of the contact openings 227 is lowered by first performing a Gas Cluster Ion Beam (GCIB) or multi-cycle SiCoNi pre-clean, and then depositing one or more metals such as, for example, titanium (Ti), cobalt (Co), nickel (Ni), or platinum (Pt), which react with the doped silicon to form a silicide layer 237. The metal deposition process can be plasma vapor deposition (PVD), atomic layer deposition (ALD), or chemical vapor deposition (CVD), for example. Examples of suitable silicide layers thus formed include SiCoNi, NiPt, NiPt/Ti, and other such combinations that are well known in the art.

At 274, the contact openings 227 and the trenches 233 are filled with a metal liner 235 and then a bulk metal. Any interconnect metals can be used such as copper (Cu), gold (Au), aluminum (Al), platinum (Pt), tungsten (W), titanium (Ti), titanium nitride (TiN), and alloys thereof, however, tungsten is preferred as the bulk metal to achieve a higher reliability. The liner is desirably made of Ti or TiN.

At 276, the metal lines are planarized to the height of the ILD 225 using a standard CMP process.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a source region by implanting ions in a layer of a substrate through a hard mask, the layer being on a buried oxide layer in the substrate, the ions being above the buried oxide layer;
    forming a drain region by implanting ions in the layer through the hard mask, the ions being above the buried oxide layer;
    forming a fin that extends between the source region and the drain region;
    forming a stress-inducing metal gate on the fin;
    forming an insulating layer overlying the stress-inducing metal gate; and
    forming contact openings in the insulating layer.

2. The method of claim 1, further including:
    forming isolation trenches; and
    forming a gate dielectric and filling the isolation trenches during one film deposition processing step.

3. The method of claim 2, wherein forming the fin and forming the isolation trenches occur during one etch processing step.

4. The method of claim 1, further comprising forming an interconnect layer and coupling the interconnect layer to at least the stress-inducing metal gate by filling the contact openings.

5. The method of claim 1, wherein forming the stress-inducing metal gate includes depositing and patterning a stress-inducing metal film.

6. The method of claim 5, wherein forming the stress-inducing metal gate further includes depositing an optical planarization material on the stress-inducing metal film.

7. The method of claim 1 wherein the hard mask is used to form the source and drain regions and the fin.

8. The method of claim 1, wherein forming the stress-inducing metal gate does not include using a replacement gate.

9. The method of claim 2, wherein the gate dielectric is a high-k material having a dielectric constant greater than about 4.0.

10. A method, comprising:
    forming a source region of an n-type transistor by implanting negative ions in a silicon substrate, a lower boundary of the source region corresponding to a top surface of a buried oxide layer in the silicon substrate;
    forming a drain region of the n-type transistor by implanting negative ions in the silicon substrate, a lower boundary of the drain region corresponding to the top surface of the buried oxide layer;
    forming a fin extending away from a surface of the silicon substrate, the fin extending between the source region and the drain region;
    covering the fin with a gate dielectric; and
    forming a metal gate in contact with the gate dielectric, the metal gate inducing a tensile stress in the fin.

11. The method of claim 10, wherein the metal gate includes a single tungsten layer that induces the tensile stress in the fin.

12. The method of claim 11, wherein forming the metal gate includes applying an optical planarization layer on top of the single tungsten layer.

13. The method of claim 10, wherein the metal gate is formed by a deposition process in which a process parameter is adjusted according to tensile stress measurements of the fin.

14. The method of claim 13 wherein the tensile stress measurements are performed during the deposition process.

15. A method, comprising:
    forming a source region of a p-type transistor by implanting positive ions in a silicon substrate to a lower implant depth determined by an interface between a silicon layer on a buried oxide layer and the buried oxide layer;
    forming a drain region of the p-type transistor by implanting positive ions in the silicon substrate to the lower implant depth determined by the interface between the silicon layer and the buried oxide layer;
    forming a fin extending away from a surface of the silicon substrate, the fin extending between the source region and the drain region;
    covering the fin with a gate dielectric; and
    forming a metal gate in contact with the gate dielectric, the metal gate inducing a compressive stress in the fin.

16. The method of claim 15, wherein the metal gate includes a tungsten layer on a titanium nitride layer that induces the compressive stress in the fin.

17. The method of claim 16, wherein forming the metal gate includes applying an optical planarization layer on the tungsten layer.

18. The method of claim 15, wherein the metal gate is formed by a deposition process in which a process parameter is adjusted according to compressive stress measurements of the fin.

19. The method of claim 18 wherein the compressive stress measurements are performed during the deposition process.

* * * * *